(12) United States Patent
Taniuchi (10) Patent No.: US 11,016,137 B2
(45) Date of Patent: May 25, 2021

(54) SEMICONDUCTOR INSPECTION JIG

(71) Applicant: Mitsubishi Electric Corporation, Tokyo (JP)

(72) Inventor: Tomohito Taniuchi, Nagasaki (JP)

(73) Assignee: Mitsubishi Electric Corporation, Tokyo (JP)

( * ) Notice: Subject to any disclaimer, the term of this patent is extended or adjusted under 35 U.S.C. 154(b) by 493 days.

(21) Appl. No.: 15/969,800

(22) Filed: May 3, 2018

(65) Prior Publication Data

US 2019/0137561 A1    May 9, 2019

(30) Foreign Application Priority Data

Nov. 8, 2017    (JP) .............................. JP2017-215456

(51) Int. Cl.
*G01R 31/26*    (2020.01)
*G01R 1/067*    (2006.01)
*G01R 1/04*    (2006.01)

(52) U.S. Cl.
CPC ......... *G01R 31/2601* (2013.01); *G01R 1/045* (2013.01); *G01R 1/0408* (2013.01); *G01R 1/0416* (2013.01); *G01R 1/06772* (2013.01); *G01R 1/0466* (2013.01)

(58) Field of Classification Search
CPC ........................... G01R 31/26; G01R 31/2601; G01R 31/2863; G01R 31/2865; G01R 1/0408; G01R 1/045; G01R 1/0433; G01R 1/06772
See application file for complete search history.

(56) References Cited

U.S. PATENT DOCUMENTS

| 6,046,868 A | 4/2000 | Theriault et al. |
| 2015/0091599 A1* | 4/2015 | Okada ............... H01L 21/67265 |
| | | 324/756.01 |
| 2018/0164344 A1* | 6/2018 | Kitagawa ............... G01R 1/045 |

FOREIGN PATENT DOCUMENTS

| JP | S55-64206 A | 5/1980 |
| JP | H09-94640 A | 4/1997 |
| JP | H11-295384 A | 10/1999 |

OTHER PUBLICATIONS

An Office Action; "Notice of Reasons for Refusal," mailed by the Japanese Patent Office dated Mar. 9, 2021, which corresponds to Japanese Patent Application No. 2017-215456 and is related to U.S. Appl. No. 15/969,800; with English language translation.

* cited by examiner

*Primary Examiner* — Amy He
(74) *Attorney, Agent, or Firm* — Studebaker & Brackett PC (57) ABSTRACT

A semiconductor inspection jig includes: a jig body having a recessed part provided on a top surface of the jig body; a printed circuit board provided on the top surface of the jig body; a GND block provided in the recessed part and having first and second side faces opposite to each other; first and second blocks provided in the recessed part and sandwiching the GND block; a push-up part pushing up the GND block from a bottom surface of the recessed part; a first press part pressing the first block against the first side face of the GND block; and a second press part pressing the second block against the second side face of the GND block.

18 Claims, 7 Drawing Sheets

SEMICONDUCTOR INSPECTION JIG

BACKGROUND OF THE INVENTION

Field

The present invention relates to a semiconductor inspection jig used for inspecting a semiconductor device.

Background

In an RF test on a high frequency power amplifier, a lead of a device to be inspected is brought into contact with a transmission line of a printed circuit board and a GND block is brought into contact with a rear surface of the device. If the device is warped, the contact between the rear surface of the device and the GND block becomes poor and the heat dissipation property of the device deteriorates. As a result, the temperature of the device rises, which prevents accurate measurement of characteristics of the device. Even when a conductive contact sheet is provided between the two, the contact sheet becomes worn out by use over a long period of time. In order to cope with such a situation, a semiconductor inspection jig is proposed which presses the GND block against the rear surface of the device while making the GND block slide over a slope (e.g., see JP 11-295384 A).

SUMMARY

However, to make the GND block slide, a wide spacing needs to be provided between the GND block and the printed circuit board. Therefore, a contact state between the lead of the device and the transmission line of the printed circuit board varies depending on a position at which the device is placed on the GND block, and so measured values of the device characteristics fluctuate, making it impossible to accurately measure the device characteristics.

The present invention has been implemented to solve the above problem, and it is an object of the present invention to provide a semiconductor inspection jig capable of accurately measuring device characteristics.

A semiconductor inspection jig according to the present invention includes: a jig body having a recessed part provided on a top surface of the jig body; a printed circuit board provided on the top surface of the jig body; a GND block provided in the recessed part and having first and second side faces opposite to each other; first and second blocks provided in the recessed part and sandwiching the GND block; a push-up part pushing up the GND block from a bottom surface of the recessed part; a first press part pressing the first block against the first side face of the GND block; and a second press part pressing the second block against the second side face of the GND block.

In the present invention, the GND block is pushed up by the push-up part, which improves adhesion between the rear surface electrode of the semiconductor device and the GND block and improves a heat dissipation property of the semiconductor device. Furthermore, the second press part press the first and second blocks against the first and second side faces of the GND block respectively, eliminate gaps between the two, and thereby cause heat to diffuse in the horizontal direction as well, which improves a heat dissipation property. Moreover, since the GND block need not be slid in the horizontal direction, the spacing between the GND block and the printed circuit board can be reduced. Therefore, since variations of the spacings between the semiconductor device placed on the GND block and the printed circuit board are small, fluctuations of the measured value of the device characteristics are small. As a result, the device characteristics can be measured accurately.

Other and further objects, features and advantages of the invention will appear more fully from the following description.

DESCRIPTION OF EMBODIMENTS

A semiconductor inspection jig according to the embodiments of the present invention will be described with reference to the drawings. The same components will be denoted by the same symbols, and the repeated description thereof may be omitted.

First Embodiment

Figure 1:
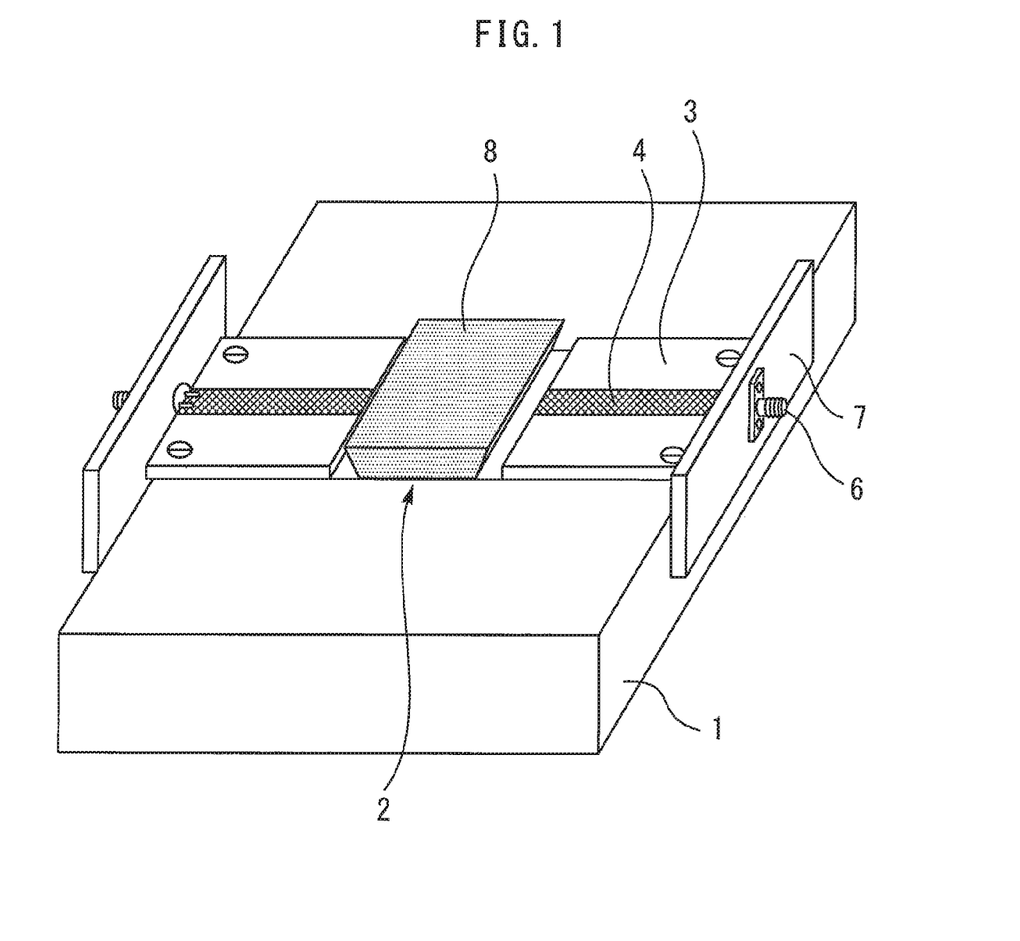
FIG. 1 is a perspective view illustrating a semiconductor inspection jig according to a first embodiment.
Figure 2:
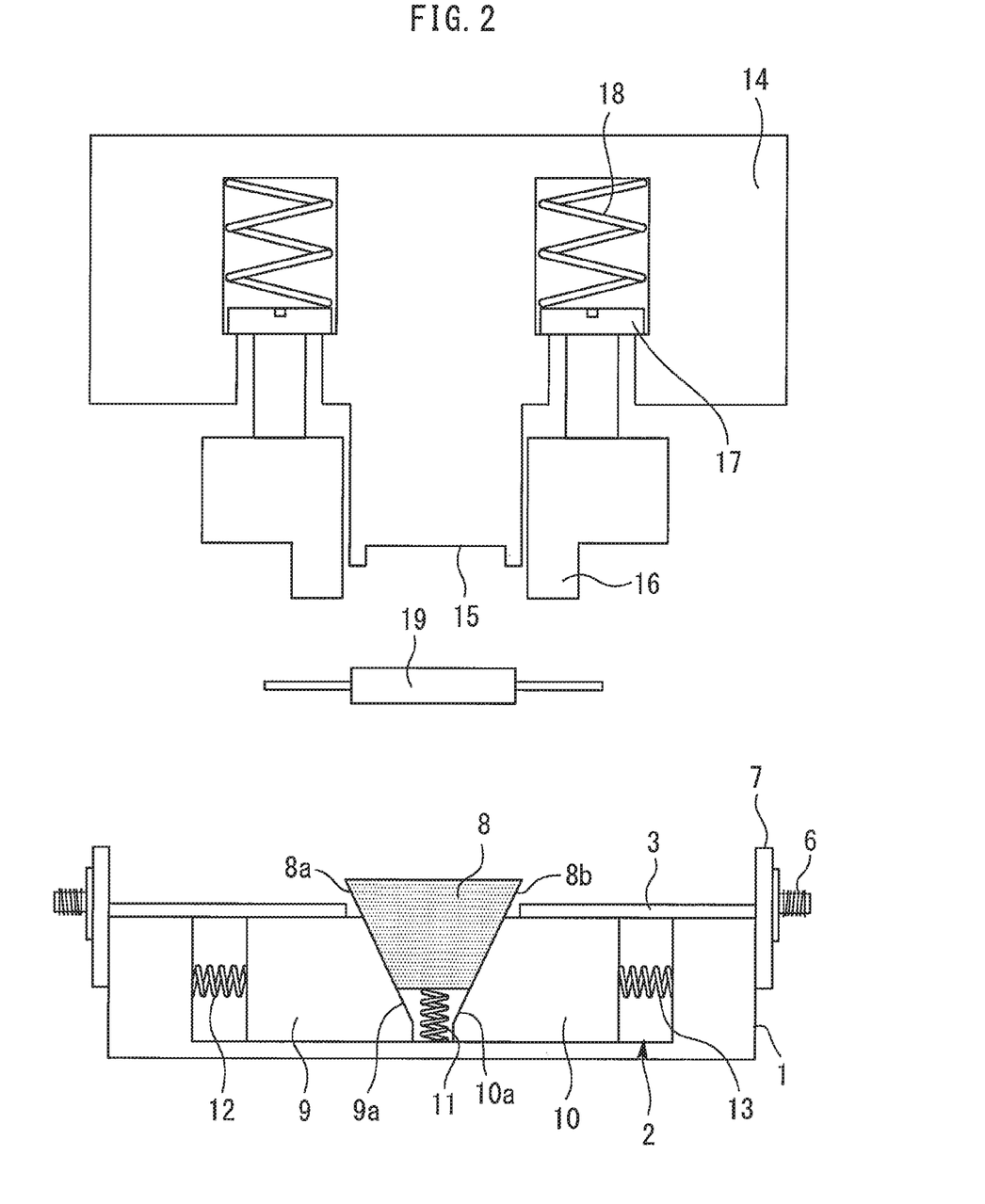
FIG. 2 is a cross-sectional view illustrating the semiconductor inspection jig according to the first embodiment.
Figure 3:
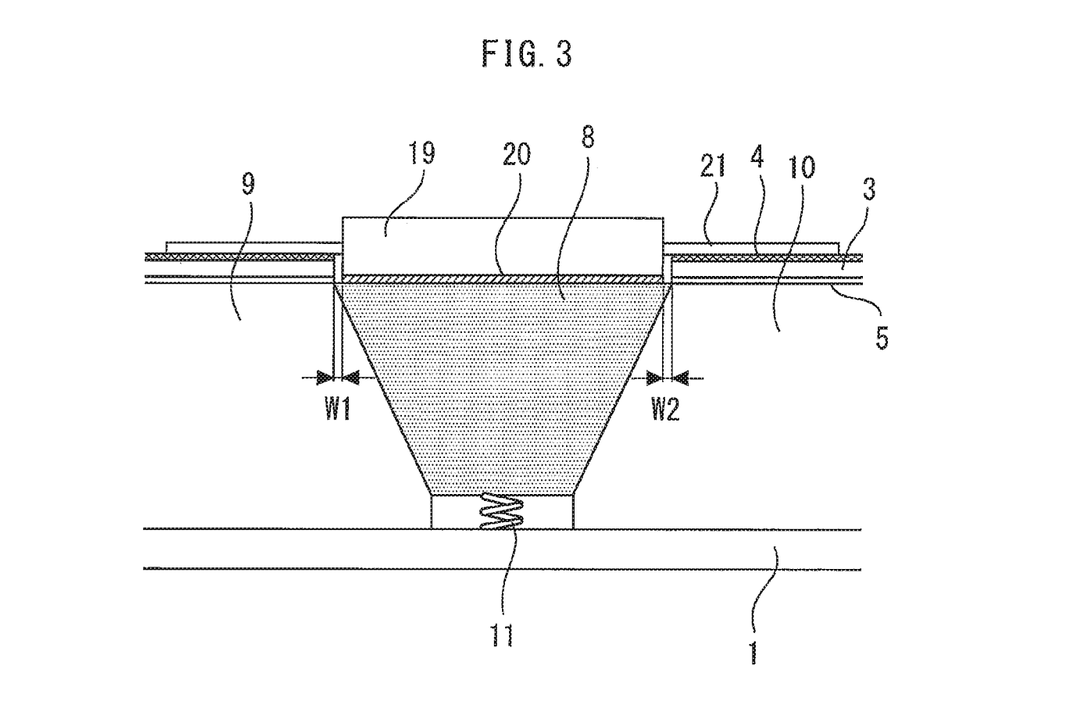
FIG. 3 is a cross-sectional view illustrating a situation in which a semiconductor device is placed on the semiconductor inspection jig according to the first embodiment.

FIG. 1 is a perspective view illustrating a semiconductor inspection jig according to a first embodiment. FIG. 2 is a cross-sectional view illustrating the semiconductor inspection jig according to the first embodiment. FIG. 3 is a cross-sectional view illustrating a situation in which a semiconductor device is placed on the semiconductor inspection jig according to the first embodiment.

A recessed part 2 is provided on a top surface of a jig body 1. A printed circuit board 3 is provided on the top surface of the jig body 1. The printed circuit board 3 is a micro strip line provided with a transmission line 4 and a GND conductor 5 provided on a top surface and on an undersurface of a dielectric respectively. An RF connector 6 is connected to the transmission line 4. A connector support 7 holds the RF connector 6.

A GND block 8, and first and second blocks 9 and 10 are provided in the recessed part 2. The first and second blocks 9 and 10 are movable in a horizontal direction and sandwich the GND block 8. A spring 11 pushes up the GND block 8 from a bottom surface of the recessed part 2. Springs 12 and 13 press the first and second blocks 9 and 10 respectively against first and second side faces 8a and 8b opposite to each other of the GND block 8.

The first and second side faces 8a and 8b of the GND block 8 are slopes. The first and second blocks 9 and 10 include first and second slopes 9a and 10a in surface contact with the first and second side faces 8a and 8b respectively.

A collet 14 includes a device pressing part 15 and lead pressing parts 16. The lead pressing parts 16 are attached so as to be movable in a vertical direction by screws with a shaft 17 and are pressed downward by springs 18.

When a semiconductor device 19 is inspected, the semiconductor device 19 is placed on the GND block 8. The device pressing part 15 of the collet 14 places a load on the semiconductor device 19. In this way, the top surface of the GND block 8 comes into contact with a rear surface electrode 20 provided on a package rear surface of the semiconductor device 19 which is an inspection target. The lead pressing parts 16 press a lead 21 of the semiconductor device 19. Thus, the transmission line 4 provided on the top surface of the printed circuit board 3 comes into contact with the lead 21 protruding from a package side face of the semiconductor device 19. In this case, when the GND block 8 moves downward, the first and second blocks 9 and 10 sandwiching the GND block 8 expand horizontally.

In the present embodiment, the GND block 8 is pushed up by the spring 11, which improves adhesion between the rear surface electrode 20 of the semiconductor device 19 and the GND block 8 and improves a heat dissipation property of the semiconductor device 19. Furthermore, the springs 12 and 13 press the first and second blocks 9 and 10 against the first and second side faces 8a and 8b of the GND block 8 respectively, eliminate gaps between the two, and thereby cause heat to diffuse in the horizontal direction as well, which improves a heat dissipation property. Moreover, since the GND block 8 need not be slid in the horizontal direction, the spacing between the GND block 8 and the printed circuit board 3 can be reduced. Therefore, since variations of the spacings W1 and W2 between the semiconductor device 19 placed on the GND block 8 and the printed circuit board 3 are small, fluctuations of the measured value of the device characteristics are small. As a result, the device characteristics can be measured accurately.

A cross-sectional shape of the GND block 8 is symmetric with respect to the first side face 8a side and the second side face 8b side. In this way, when the semiconductor device 19 is pressed against the GND block 8, lateral pressures uniformly apply to the left and right springs 12 and 13, and the GND block 8 is pushed straight down. Therefore, after the semiconductor device 19 comes into contact with the GND block 8, frictions never occur between the two in the horizontal direction, causing no damage to the rear surface electrode 20 of the semiconductor device 19.

Furthermore, a cross-sectional shape of the GND block 8 is inverted trapezoidal. Thus, when the first and second blocks 9 and 10 are pressed against the first and second side faces 8a and 8b of the GND block 8, a pressure applies in a direction in which the GND block 8 is pushed up.

Note that a horizontal distance between the jig body 1 and the first and second blocks 9 and 10 beneath the printed circuit board 3 is preferably set to be equal to or less than λ/4 of the measured frequency. If the measured frequency is, for example, 10 GHz, the distance is set to be equal to or less than 3 cm. In this way, a variation of characteristic impedance with respect to a wavelength of an input signal can be ignored. Too large a horizontal distance may weaken a GND property of the printed circuit board 3, worsen VSWR, and thereby cause an adverse effect on the measured value of device characteristics.

Figure 4:
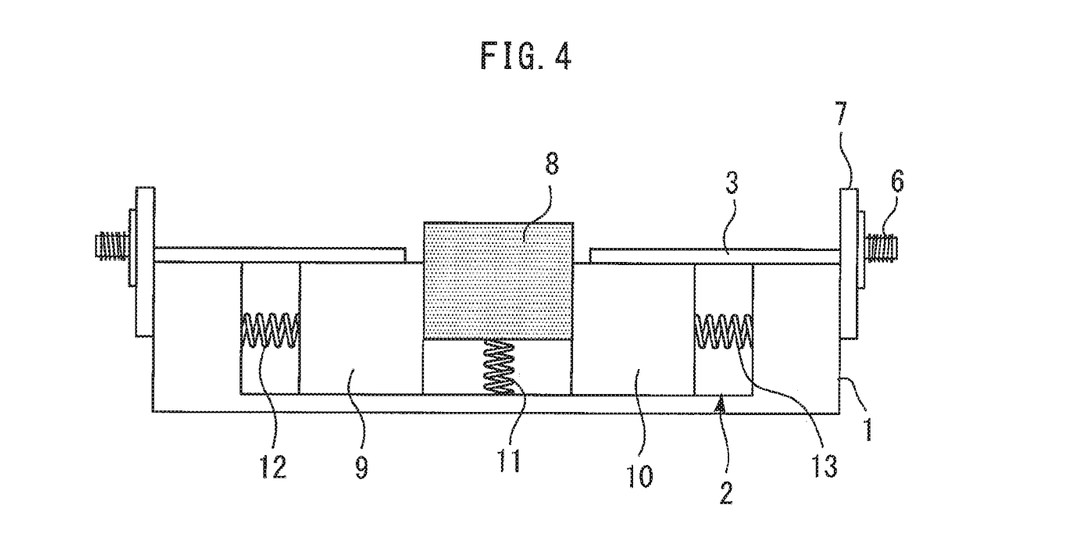
FIG. 4 is a cross-sectional view illustrating a modification of the semiconductor inspection jig according to the first embodiment.

FIG. 4 is a cross-sectional view illustrating a modification of the semiconductor inspection jig according to the first embodiment. The side faces of the GND block 8 are formed of vertical surfaces. The side faces of the first and second blocks 9 and 10 which is in surface contact with those side faces are also vertical surfaces. The other configuration is similar to that of the semiconductor inspection jig according to the first embodiment. In this case, device characteristics can be accurately measured in the same way as in the first embodiment.

Second Embodiment

Figure 5:
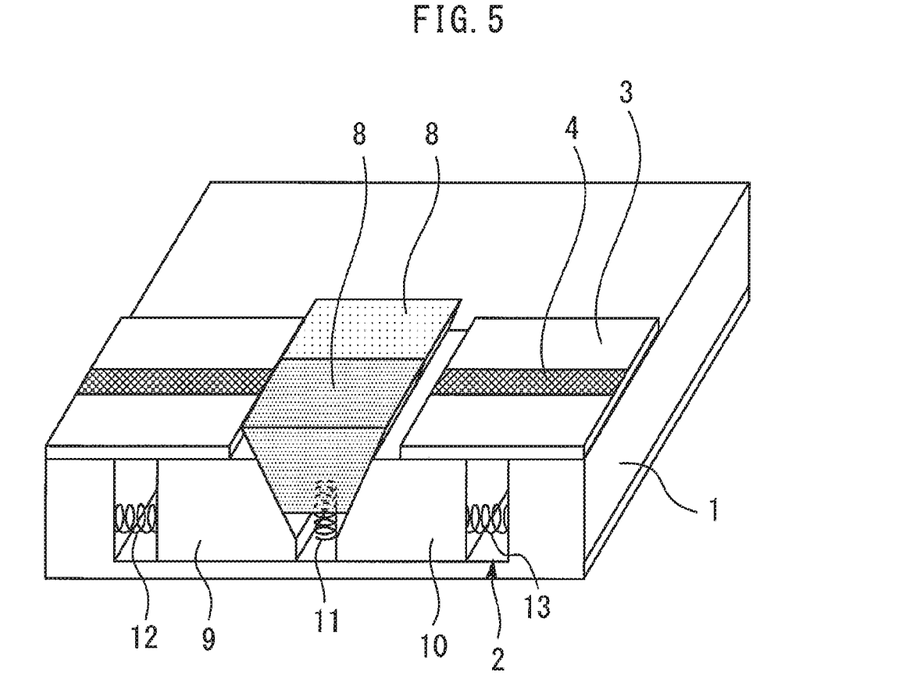
FIG. 5 is a perspective cross-sectional view illustrating a semiconductor inspection jig according to a second embodiment.

FIG. 5 is a perspective cross-sectional view illustrating a semiconductor inspection jig according to a second embodiment. In the present embodiment, the GND block 8 is divided into two upper and lower parts in a plan view. The divided GND blocks 8 are individually pushed up by the respective springs 11. Thus, even when a package of the semiconductor device 19 is warped, adhesion improves and a high heat dissipation property can be achieved. The other configuration and effects are similar to those of the first embodiment.

Third Embodiment

Figure 6:
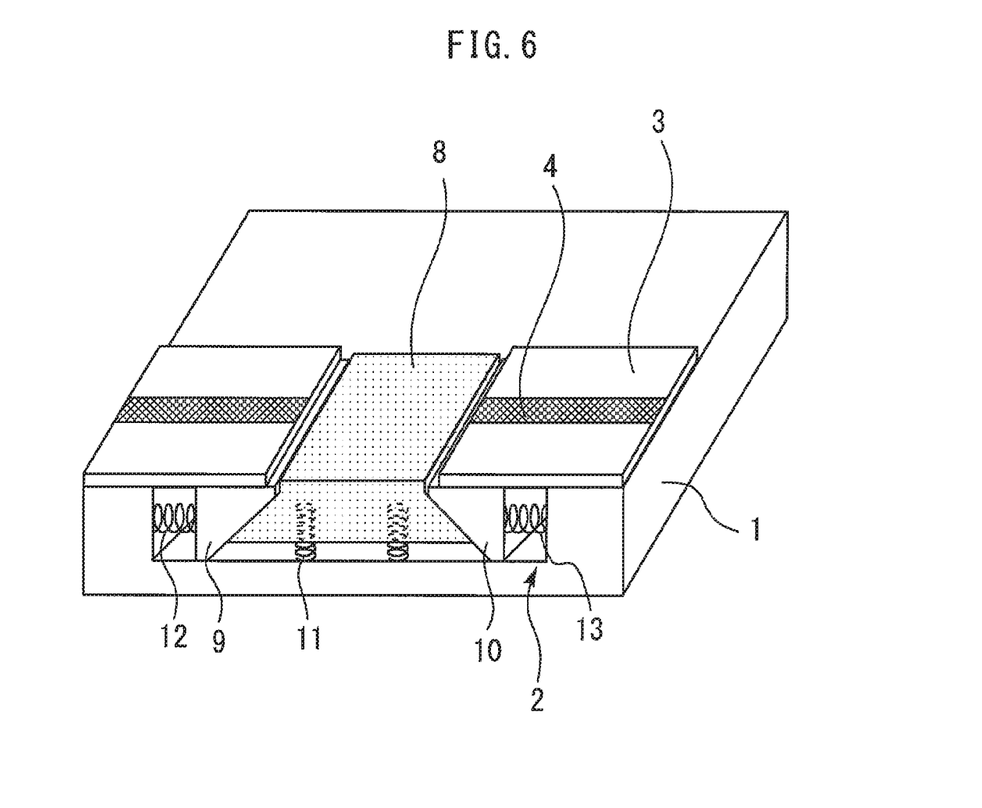
FIG. 6 is a perspective cross-sectional view illustrating a semiconductor inspection jig according to a third embodiment.

FIG. 6 is a perspective cross-sectional view illustrating a semiconductor inspection jig according to a third embodiment. In the present embodiment, a cross-sectional shape of the GND block 8 is trapezoidal. This allows the size of the GND block 8 to be greater than in the case of the reverse trapezoidal shape, and so a heat dissipation property improves. However, pressing the first and second blocks 9 and 10 against the first and second side faces 8a and 8b of the GND block 8 causes a pressure to apply in a direction in which the GND block 8 is pushed down, and so a pushing force of the spring 11 needs to be increased accordingly.

Furthermore, since heat generally diffuses in a 45-degree direction, setting an angle of the slope of the GND block 8 to 45 degrees makes it possible to obtain a higher heat dissipation property than that of the first embodiment. The other configuration and effects are similar to those of the first embodiment.

Fourth Embodiment

Figure 7:
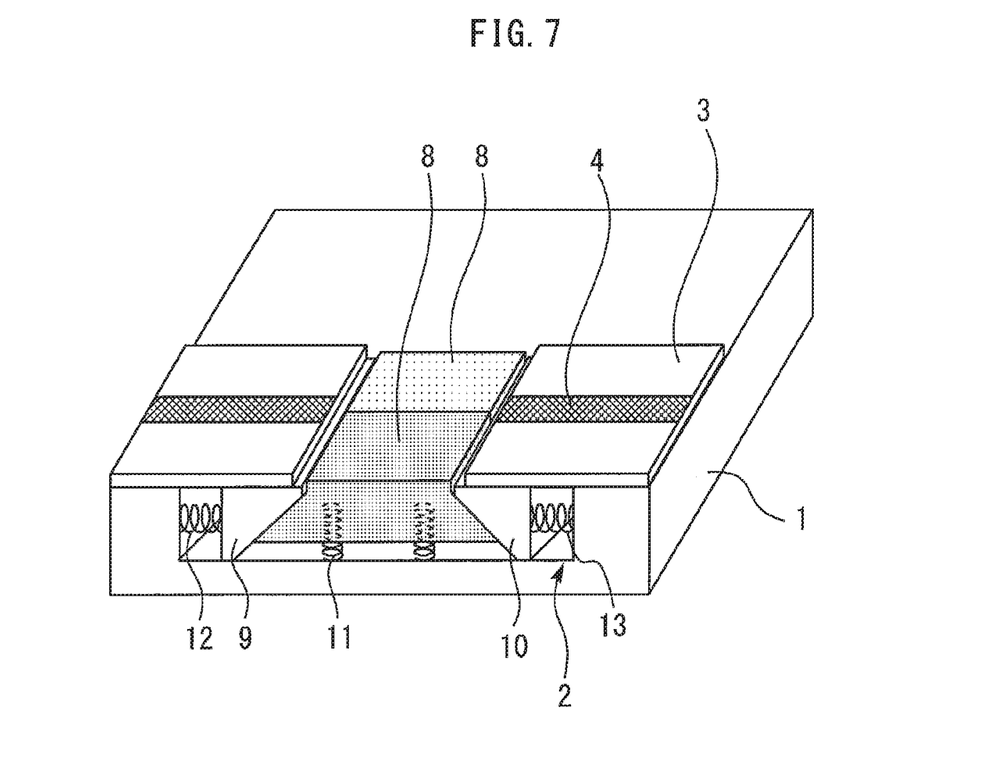
FIG. 7 is a perspective cross-sectional view illustrating a semiconductor inspection jig according to a fourth embodiment.

FIG. 7 is a perspective cross-sectional view illustrating a semiconductor inspection jig according to a fourth embodiment. In the present embodiment, the GND block 8 is divided into two upper and lower parts in a plan view. Thus, even when the package of the semiconductor device 19 is warped, adhesion improves and a high heat dissipation property can be achieved. The other configuration and effects are similar to those of the third embodiment.

Fifth Embodiment

Figure 8:
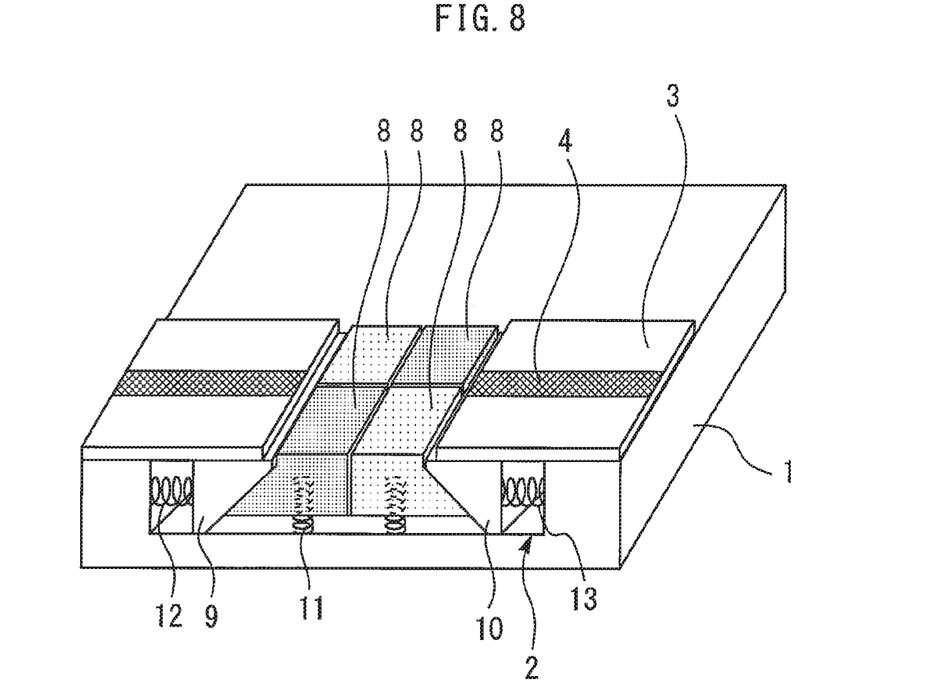
FIG. 8 is a perspective cross-sectional view illustrating a semiconductor inspection jig according to a fifth embodiment.

FIG. 8 is a perspective cross-sectional view illustrating a semiconductor inspection jig according to a fifth embodiment. In the present embodiment, the GND block 8 is divided into four upper and lower, and left and right parts in a plan view. Thus, adhesion improves more than that of the fourth embodiment and a high heat dissipation property can be achieved. The other configuration and effects are similar to those of the third and fourth embodiments. Note that in the second, fourth and fifth embodiments, the GND block 8 can be divided not only into two or four parts, but also into a plurality of parts.

Obviously many modifications and variations of the present invention are possible in the light of the above teachings.

It is therefore to be understood that within the scope of the appended claims the invention may be practiced otherwise than as specifically described.

The entire disclosure of Japanese Patent Application No. 2017-215456, filed on Nov. 8, 2017 including specification, claims, drawings and summary, on which the Convention priority of the present application is based, is incorporated herein by reference in its entirety.

The invention claimed is:

1. A semiconductor inspection jig comprising:
a jig body having a recessed part provided on a top surface of the jig body;
a printed circuit board provided on the top surface of the jig body;
a GND block provided in the recessed part and having first and second side faces opposite to each other, the first and second side faces being slopes;
first and second blocks provided in the recessed part and sandwiching the GND block;
a push-up part pushing up the GND block from a bottom surface of the recessed part;
a first press part pressing the first block against the first side face of the GND block; and
a second press part pressing the second block against the second side face of the GND block,
wherein the first and second blocks include first and second slopes in surface contact with the first and second side faces, respectively.

2. The semiconductor inspection jig according to claim 1, wherein a top surface of the GND block comes into contact with a rear surface electrode provided on a package rear surface of a semiconductor device which is an inspection target, and
a transmission line provided on a top surface of the printed circuit board comes into contact with a lead protruding from a package side face of the semiconductor device.

3. The semiconductor inspection jig according to claim 2, wherein a cross-sectional shape of the GND block is symmetric with respect to the first side face side and the second side face side.

4. The semiconductor inspection jig according to claim 3, wherein a cross-sectional shape of the GND block is inverted trapezoidal.

5. The semiconductor inspection jig according to claim 3, wherein a cross-sectional shape of the GND block is trapezoidal.

6. The semiconductor inspection jig according to claim 3, wherein the GND block is divided into a plurality of parts in a plan view.

7. The semiconductor inspection jig according to claim 3, wherein the GND block is divided into a plurality of parts in a plan view.

8. The semiconductor inspection jig according to claim 2, wherein a cross-sectional shape of the GND block is inverted trapezoidal.

9. The semiconductor inspection jig according to claim 2, wherein a cross-sectional shape of the GND block is trapezoidal.

10. The semiconductor inspection jig according to claim 2, wherein the GND block is divided into a plurality of parts in a plan view.

11. The semiconductor inspection jig according to claim 1, wherein a cross-sectional shape of the GND block is symmetric with respect to the first side face side and the second side face side.

12. The semiconductor inspection jig according to claim 11, wherein a cross-sectional shape of the GND block is inverted trapezoidal.

13. The semiconductor inspection jig according to claim 11, wherein a cross-sectional shape of the GND block is trapezoidal.

14. The semiconductor inspection jig according to claim 11, wherein the GND block is divided into a plurality of parts in a plan view.

15. The semiconductor inspection jig according to claim 11, wherein the GND block is divided into a plurality of parts in a plan view.

16. The semiconductor inspection jig according to claim 1, wherein a cross-sectional shape of the GND block is inverted trapezoidal.

17. The semiconductor inspection jig according to claim 1, wherein a cross-sectional shape of the GND block is trapezoidal.

18. The semiconductor inspection jig according to claim 1, wherein the GND block is divided into a plurality of parts in a plan view.

* * * * *